United States Patent [19]
Wyland

[11] Patent Number: 5,870,517
[45] Date of Patent: Feb. 9, 1999

[54] PACKAGE INCLUDING SELF-ALIGNED LASER DIODE AND METHOD OF ALIGNING A LASER DIODE

[75] Inventor: Christopher P. Wyland, Santa Clara, Calif.

[73] Assignee: Integrated Device Technology, Inc., Santa Clara, Calif.

[21] Appl. No.: 946,332

[22] Filed: Oct. 7, 1997

[51] Int. Cl.⁶ .................................................. G02B 6/36
[52] U.S. Cl. .............................. 385/88; 385/19; 385/52; 385/90
[58] Field of Search ................................. 385/88–92, 14, 385/19, 49, 52; 356/139.05, 139.06, 400; 257/626, 690, 702, 703, 706, 707, 777, 779

[56] References Cited

U.S. PATENT DOCUMENTS

| | | | |
|---|---|---|---|
| 4,318,058 | 3/1982 | Mito et al. | 372/50 |
| 4,884,015 | 11/1989 | Sugimoto et al. | 356/400 |
| 5,343,546 | 8/1994 | Cronin et al. | 385/52 |
| 5,511,140 | 4/1996 | Cina et al. | 385/93 |
| 5,537,504 | 7/1996 | Cina et al. | 385/93 |
| 5,546,487 | 8/1996 | Fantone | 385/33 |
| 5,579,422 | 11/1996 | Head et al. | 385/34 |
| 5,602,955 | 2/1997 | Haske | 385/88 |
| 5,610,395 | 3/1997 | Nishiyama | 250/239 |
| 5,611,008 | 3/1997 | Yap | 385/14 |

*Primary Examiner*—Hemang Sanghaui
*Attorney, Agent, or Firm*—Skjerven,Morrill, MacPherson,Franklin & Friel

[57] ABSTRACT

A laser diode alignment package has a substrate with capacitive alignment pads. A charge generator is configured to charge or discharge each of the capacitive alignment pad to a respective voltage in response to an instruction from a processor. A laser diode chip has a conductive die paddle rigidly attached thereto and the laser diode chip is movably positioned on the substrate. The conductive die paddle is positioned with respect to the alignment pads such that when the respective voltages are applied the capacitive alignment pads, Coulomb forces will move the conductive die paddle with respect to the substrate. A feedback mechanism measures the optical power passing through the optical fiber. A processor estimates based on this measured optical power level what voltage should be applied to each of the capacitive coupling pads in order to apply Coulomb forces necessary to align the laser diode chip to the optical fiber. The processor then sends charging instructions to the charge generator. The alignment process can be fully automated thus minimizing the risk of human error. The structure and method require few, if any, moving mechanical parts in order to align the laser and requires little or no heavy equipment.

16 Claims, 3 Drawing Sheets

PACKAGE INCLUDING SELF-ALIGNED LASER DIODE AND METHOD OF ALIGNING A LASER DIODE

FIELD OF THE INVENTION

This invention relates to alignment technology and in particular to a laser diode alignment package and a method of aligning a laser diode using a feedback mechanism and Coulomb forces.

BACKGROUND

The fabrication of a laser diode on a substrate is well known in the art. Typically, laser emissions from the laser diode are transported over large distances. Optical fibers are a well known device for channeling lasers over large distances. However, in order to channel the laser, the laser diode must be properly aligned so that as much of the laser emissions as possible enter the optical fiber. Therefore, a device and method for aligning a laser diode to the optical fiber is desired.

There are a variety of prior art devices and methods of aligning one object relative to another. However, these embodiments are typically too cumbersome to effectively align two objects as small as a conventional semiconductor laser diode and an optical fiber.

One device and method is disclosed in U.S. Pat. No. 5,537,504 (Cina et al.) filed Oct. 31, 1995 which is incorporated herein by reference. This method requires the use of relatively large pieces of equipment in order to mechanically manipulate the optoelectric converter. This equipment is typically expensive and occupies valuable fab real estate. Furthermore, there are many moving parts in this package which tends to decrease the reliability of the package. Therefore, a device and method for aligning a laser diode without using overly cumbersome equipment and moving parts was desired.

SUMMARY OF THE INVENTION

In accordance with this invention, a package including a self-aligned laser diode and a method of aligning a laser diode are disclosed. The package includes a substrate with capacitive alignment pads. A charge generator is configured to charge or discharge the capacitive alignment pads to respective voltages in response to an instruction. A laser diode chip has a conductive die paddle attached thereto. The laser diode chip is movably positioned on the substrate. The conductive die paddle is positioned with respect to the alignment pads so that Coulomb forces move the conductive die paddle with respect to the substrate when the respective voltages are applied to the capacitive alignment pads.

The structure comprises a feedback mechanism which measures the optical power passing through the optical fiber. A processor determines, based on this measured optical power level, what voltage should be applied to each of the capacitive coupling pads, respectively, in order to apply Coulomb forces necessary to align the laser diode chip to the optical fiber. The processor is configured to send charging instructions to the charge generator which are appropriate to this determination.

Advantages of this invention include increased efficiency and accuracy of alignment. The alignment process can be fully automated thus minimizing the risk of human error in the alignment process. The structure and method require few, if any, moving mechanical parts in order to align the laser. This invention will be more fully understood in connection with the following detailed description taken together with the drawings.

DETAILED DESCRIPTION OF THE PREFERRED EMBODIMENTS

While embodiments of this invention will be described below, those skilled in the art will recognize that other structures and methods are capable of implementing the principles of this invention. Thus the following description is illustrative only and not limiting.

Figure 1:
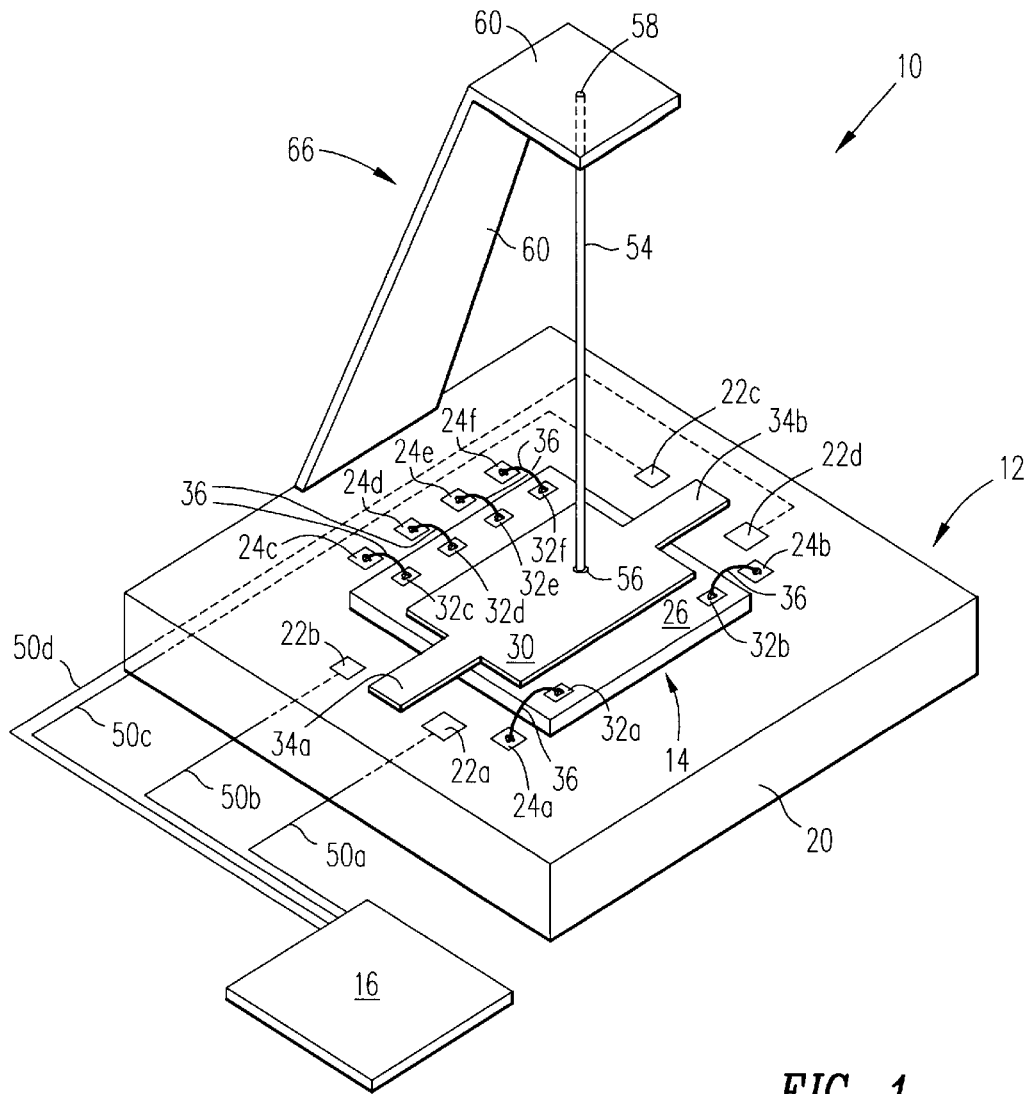
FIG. 1 illustrates a perspective view of the laser diode alignment package according to one embodiment of the invention.

FIG. 1 illustrates a perspective view of the laser diode alignment package according to one embodiment of the invention. A package 10 comprises a support 12, a laser diode chip 14, a charge generator 16 and a holder 66. Support 12 comprises a substrate 20, capacitive alignment pads (22a–22d) formed in or on substrate 20 and bond pads (24a–24f) formed in or on substrate 20.

Laser diode chip 14 comprises a body 26, a die paddle 30 formed in or on body 26 and bond pads (32a–32f) formed in or on body 26. Die paddle 30 is composed of an electrically conductive material such as copper. In one embodiment, die paddle 30 further comprises tabs (34a, 34b) which have a relatively small volume compared to the rest of die paddle 30 and extend outward from the perimeter of laser diode chip 14. Tabs (34a, 34b) are shaped and positioned so that they act as levers for die paddle 30 when Coulomb forces are applied to tabs (34a, 34b). In one embodiment, laser diode chip 14 is the same material, for example, silicon, as substrate 20. This would reduce thermal coefficient of expansion mismatches which is desirable because the mismatches can cause accelerated fatigue of the bond between laser diode chip 14 and substrate 20 when exposed to frequent temperature variations.

Each of bond pads (24a–24f) is electrically coupled to a respective one of bond pads (32a–32f) with bond wires 36 using wire bonding which is known in the art. FIG. 1 shows six bond pads (24a–24f) and six bond pads (32a–32f). However, one skilled in the art will recognize that more or less than six bond pads can be provided on support 12 and laser diode chip 14 consistent with the principles of this invention.

Figure 2:
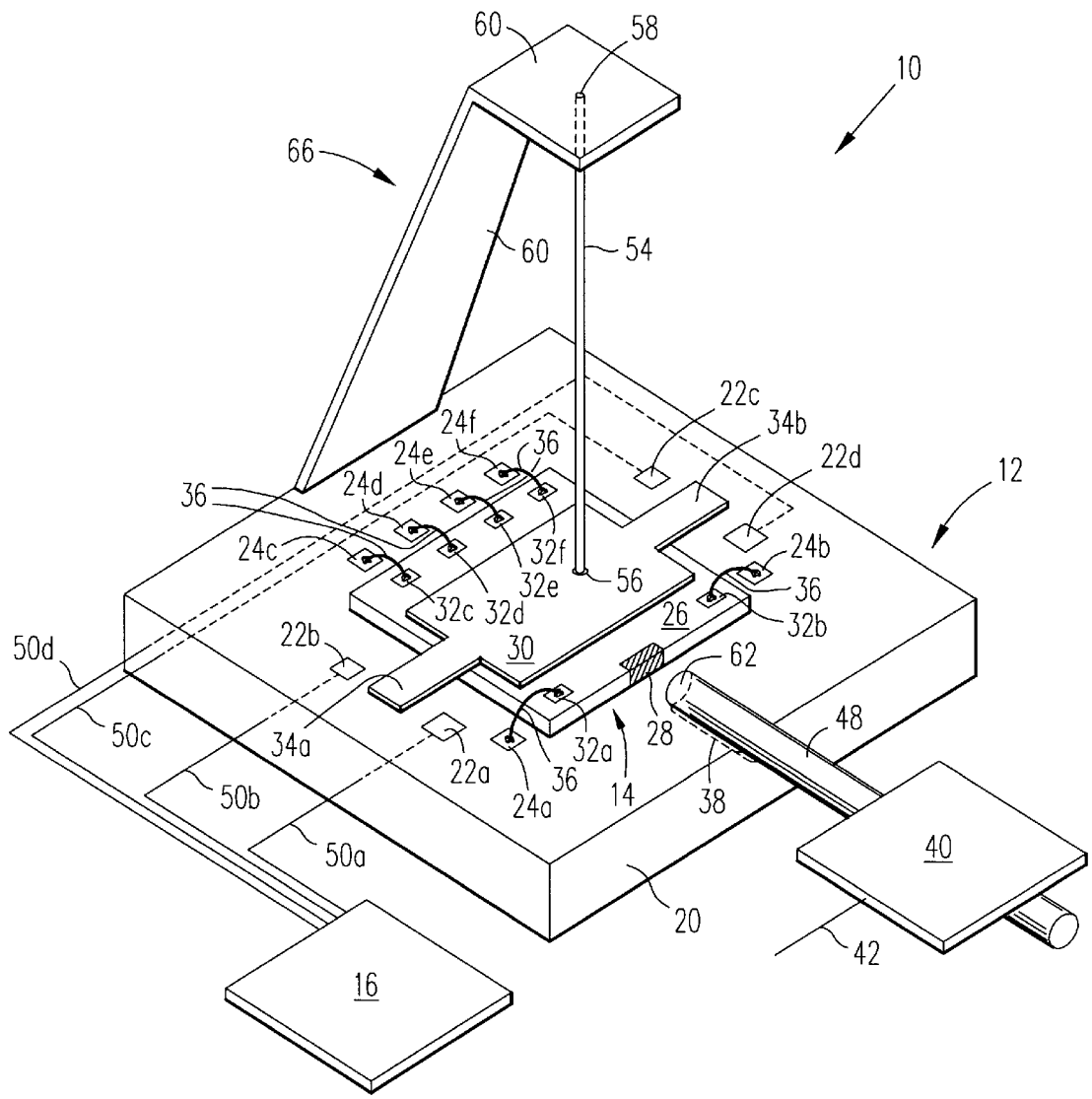
FIG. 2 illustrates a perspective view of a laser diode alignment package according to another embodiment of the invention.
Figure 3:
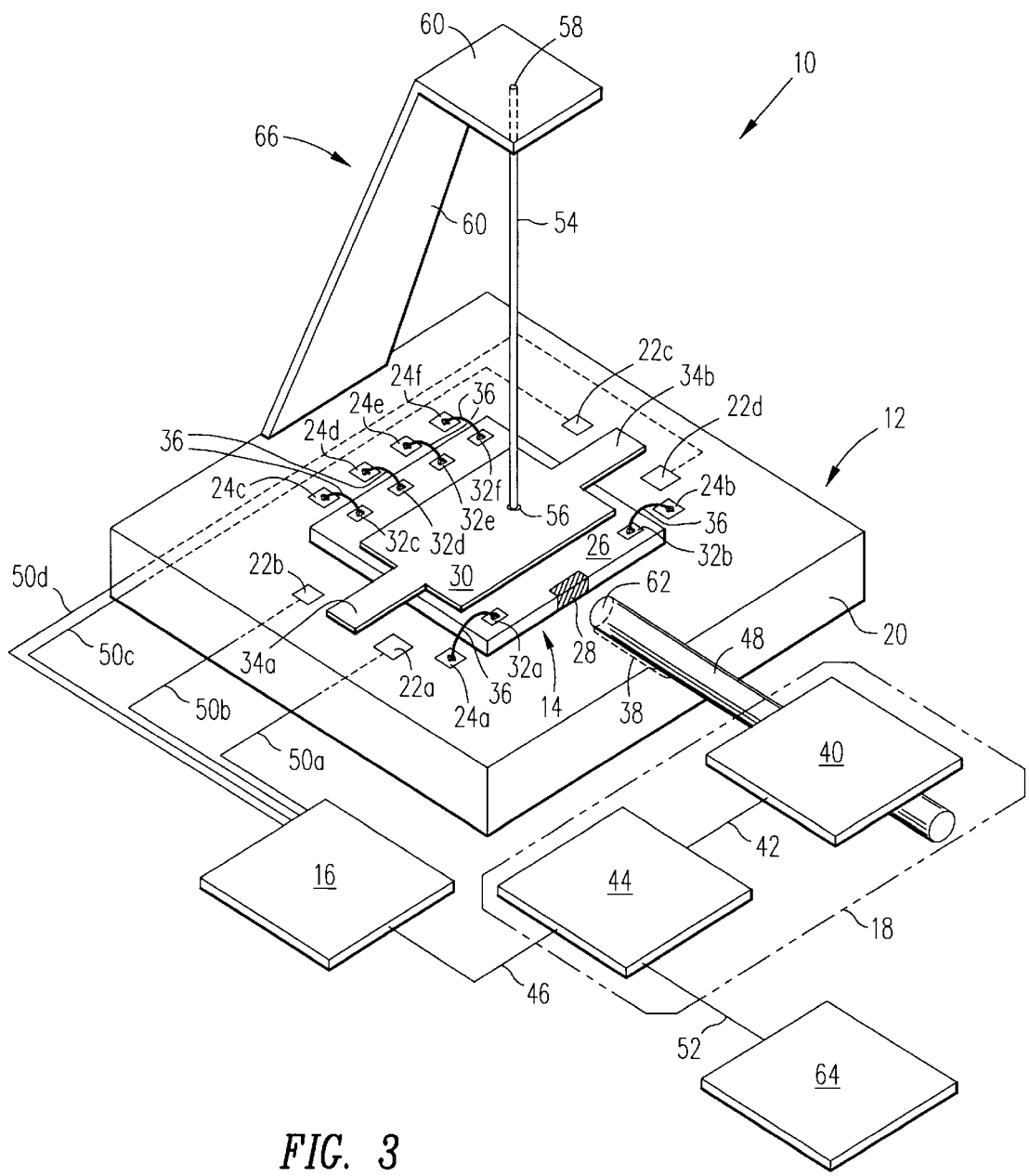
FIG. 3 illustrates a perspective view of a self aligning laser diode package according to one embodiment of the invention.

Charge generator 16 further comprises charge generator output lines (50a–50d) which are electrically coupled to respective capacitive alignment pads (22a–22d). Charge generator 16 is configured to charge each of capacitive alignment pads (22a–22d) through respective output lines (50a–50d) in response to a charging instruction. In one embodiment, charge generator 16 is a digital to analog convertor. Laser diode chip 14 is movably positioned on substrate 20 using a relatively flexible holder 66. In one embodiment, holder 66 is a vacuum chuck. In another embodiment, holder 66 comprises a mechanical pin 54 having an end 56 which is pressed against laser diode chip 14. Pin 54 also has an end 58 coupled to a rigid body 60 which is rigidly coupled to substrate 20. In other embodiments, two or more pins may be used. In FIGS. 1–3, rigid body 60 is shown directly coupled to substrate 20. However, in one embodiment, rigid body 60 is rigidly coupled to substrate 20 by being coupled to another body which is, directly or indirectly, rigidly coupled to substrate 20. In another embodiment, holder 66 is omitted and the force of gravity and the static friction of the interface between laser diode chip 14 and substrate 20 are relied upon to movably couple laser diode chip 14 to substrate 20.

If holder 66 requires a constant external force to hold laser diode chip 14 in a fixed position (i.e. spring like), charge generator is configured to hold the voltage constant until further instructions are received.

Package 10 preferably further comprises a feedback mechanism (not shown) which determines the alignment of laser diode chip 14 compared to an optimal reference alignment. The feedback mechanism then estimates the charge that should appear at each of capacitive alignment pads (22a–22d) in order to exert a Coulomb force on die paddle 30 sufficient to better align laser diode chip 14 with the optimal reference alignment. The feedback mechanism then instructs charge generator 16 to charge capacitive alignment pads (22a–22d) to this charge. The feedback mechanism repeats this process until alignment is attained within a fixed tolerance appropriate for the application.

In one embodiment, the feedback mechanism comprises a visual inspection apparatus such as a microscope (not shown) which allows a human operator to view the alignment of laser diode chip 14. It is left to the human operator to estimate the voltage that should appear at each of capacitive alignment pads (22a–22d) in order to better align laser diode chip 14. The human operator instructs charge generator 16 through a mechanism (not shown) to charge each of capacitive alignment pads (22a–22d) accordingly. In another embodiment, a machine which is capable of visually determining the alignment of laser diode chip 14 and estimating appropriate capacitive alignment pad 22 voltages is used instead of a human operator.

The embodiment that employs the human operator to determine the alignment of laser diode chip 14 allows for an alignment accuracy that is limited depending on the optical aids used and the accuracy of the vision of the human operator. Still, with the appropriate equipment, this kind of alignment can give an alignment accuracy of as little as a few microns. However, with the rapidly decreasing feature dimension sizes of integrated circuits, this alignment accuracy is not refined enough for many applications. Typically, for the alignment of a semiconductor laser diode to an optical fiber, a more accurate alignment is advantageous.

FIG. 2 illustrates a prospective view of a laser diode alignment package according to another embodiment of the invention. FIG. 2 shows all the elements of FIG. 1 with some additional elements as described hereafter. An operational laser diode 28 is fabricated on body 26 of laser diode chip 14. Power for laser diode 28 can be supplied, for example, from one or more of bond pads (24a–24f). In this embodiment, since power must be supplied before alignment is complete, the laser diode must be already roughly aligned so that when laser diode chip 14 moves to final alignment, the integrity of the power connection remains secure regardless of the movement of laser diode chip 14. If power is to be supplied through bond wires 36, for example, laser diode chip 14 should not move more than a few mils once bond wires 36 are connected so as to minimize the risk of fracture or strain on bond wires 36.

An optical fiber 48 is mechanically coupled to substrate 20 such that the position of an open end 62 of optical fiber 48 for receiving light from laser diode 28 is fixed with respect to substrate 20. In one embodiment, substrate 20 defines a trench 38 with optical fiber 48 supported by trench 38 using, for example, mechanical compression of the sides of trench 38 against optical fiber 48 or by adhesion within trench 38.

An optical power meter 40 is coupled to optical fiber 48 such that optical power meter 40 can determine the optical power that passes through optical fiber 48. In one embodiment, the optical power meter 40 is a Newport 4832-C power meter made by Newport Corporation, P.O. Box 1960, Irvine, Calif., 92623-9607. Optical power meter 40 is configured to periodically or continuously drive meter output line 42 with a serial signal representative of the level of measured power. On one embodiment meter output line 42 comprises a plurality of parallel output lines configured to receive parallel signals representative of the level of measured power.

In one embodiment, meter output lines 42 are coupled to a human interface. A human operator estimates based on the optical power reading what voltages should appear at each of capacitive alignment pads (22a–22d) in order to better align laser diode 28 to optical fiber 48. This embodiment allows for better alignment because it eliminates the need for a human operator to directly visually monitor the position of laser diode 28 with respect to optical fiber 48. However, it is advantageous to eliminate human intervention completely when aligning to within a few microns.

FIG. 3 illustrates a perspective view of a self aligning laser diode package according to one embodiment of the invention. FIG. 3 shows all the elements of FIG. 2 with some additional elements as described hereafter. The feedback mechanism further comprises a processor 44 and processor output line 46. In one embodiment, processor output line 46 comprises a plurality of output lines connected in parallel for receiving parallel signals. Optical power meter 40 is configured to periodically or continuously drive meter output lines 42 with a signal representative of the level of measured power.

Processor 44 is configured to determine the level of measured power based on the signals on meter output lines 42. Processor 44 is also configured to determine if a maximum optical power from laser diode 28 is entering optical fiber 48. Processor 44 is further configured, when processor 44 determines that a maximum optical power is not present, to determine estimated voltage levels on capacitive alignment pads (22a–22d) which would cause laser diode chip 14 to better align laser diode 14 to a position that would allow for more optical power from laser diode 28 to enter optical fiber 48.

Processor 44 is configured to drive processor output lines 46 with signals indicative of instructions appropriate to cause charge generator 16 to send or withdraw charge through output lines (50a–50d) sufficient to charge or discharge capacitive alignment pads (22a–22d) to the estimated voltage.

When, for example, capacitive alignment pad 22a is charged with a positive voltage, because die paddle 30 is a conductive body of relatively large volume, negative charges will be attracted to tab 34a. Coulomb's law dictates that a force will be applied attracting two oppositely charged bodies. Therefore, charging capacitive alignment pad 22a will apply an attractive force to tab 34a. The same applies for the interaction of all of the other capacitive coupling pads with the respective tabs. These forces will be simply referred to as Coulomb forces.

Algorithms for determining if maximum power has been obtained are numerous. One method will be described hereafter. The laser diode is first moved closer to open end 62 through the following process. First, processor 44 reads the signal on meter output line 42 and determines the power passing through optical fiber 48 based on this signal. If this power is greater than a variable maxpower (maxpower is a variable indicating the maximum power read from meter output line 42), maxpower is set equal to the new power reading. Processor 44 then instructs charge generator 16 to charge capacitive alignment pads (22a, 22d) with a charge to attract laser diode chip 14 towards open end 62. Processor 44 reads the resultant new signal. If the new power reading is greater than maxpower, maxpower is set equal to the new power reading. Processor 44 instructs charge generator 16 to put a greater negative charge on capacitive alignment pads (22a, 22d). This process is repeats until the new power reading is equal to maxpower. This means that increasing the charge on capacitive alignment pads (22a, 22d) will not further align laser diode chip 14 to open end 62.

At this point, laser diode 28 is further aligned with open end 62 by rotating laser diode chip 14. This is done through the following process. First, processor 44 reads the signal on meter output line 42 and determines the power passing through optical fiber 48 based on this signal. Processor 44 then instructs charge generator 16 to charge capacitive alignment pads (22a, 22c) with an attractive charge which acts to turn laser diode chip 14 slightly counterclockwise as viewed from the top. Processor 44 reads the resultant new signal from meter output line 42.

If the new power reading is greater than maxpower, maxpower is set equal to the new power reading. Processor 44 instructs charge generator 16 to put a greater attractive charge on capacitive alignment pads (22a, 22c).

If the new power reading is less than maxpower, then laser diode chip 14 has been turned further out of alignment. Accordingly, processor 44 instructs charge generator 16 to put a greater attractive charge on capacitive alignment pads (22b, 22d) to turn laser diode chip 14 clockwise as viewed from the top.

Through this, processor 44 determines which direction laser diode chip 14 needs to be turned in order to align with open end 62. Processor 44 then continues to incrementally put more attractive charge on the respective alignments pads (22a, 22c for counterclockwise turning; 22b, 22d for clockwise turning) until incremental charge increases no longer increase the measured power through optical fiber 48.

Processor 44 is also configured, when processor 44 determines that a maximum optical output has been reached, to drive status line 52 with a signal to, for example, an interface 64 such as a user interface, the signal being indicative of a maximum optical power status.

Interface 64 may also comprises a mechanism that attaches laser diode chip 14 to substrate 20 when status line 52 is driven with a signal indicative of a maximum optical power being reached. For example, interface 64 may comprise an RF heat generator that cures a bond between laser diode chip 14 and substrate 20 when the heat generator receives a signal on status line 52 that is indicative of a maximum optical power being reached. In other embodiments, interface 64 comprises an infrared heat source. This feedback mechanism allows for a greater alignment accuracy than in the embodiment that implements a human operator as part of the feedback mechanism.

In one embodiment, laser diode chip 14 is positioned on substrate 20 such that at least a portion of the laser from laser diode chip 14 enters optical fiber 48 so that processor 44 can determine the effect of the last iteration of movement of laser diode chip 14. This information typically assists the processor in making a good estimate of the next iteration in laser diode chip 14 movement.

Furthermore, tab 34a must be close enough to capacitive alignment pads (22a, 22b) and tab 34b must be close enough to capacitive alignment pads (22c, 22d) such that charge generator 16 is capable of charging capacitive alignment pads (22a–22d) with a charge great enough to better align laser diode chip 14. A feedback mechanism 18 allows for a greater alignment accuracy than in the embodiment that implements the human eye as part of the feedback mechanism. In another embodiment, the human eye and capacitive alignment pads (22a–22d) are first used to position laser diode chip 14 to within, for example, a few microns. Next, feedback mechanism 18 is used to refine the alignment to maximize the lazed power through optical fiber 48.

The method of fabricating self aligning laser diode package 10 comprises the following steps as described with reference to FIG. 3. The order of the following steps is not relevant except where explicitly noted. Furthermore, all or part of any of the following steps can be performed beforehand thereby eliminating a need for performance of that step or part of step in this method. First, the steps preparatory for alignment are provided below.

Step 1. Circuitry (not shown) required to provide power, voltage references, and/or signals to laser diode chip 14 are fabricated on substrate 20. Capacitive alignment pads (22a–22d) and bond pads (24a–24f) are fabricated on substrate 20.

Step 2. Laser diode 28 and bond pads (32a–32f) are fabricated on body 26. Furthermore, circuitry (not shown) required to provide power, voltage references, and/or signals to laser diode laser diode 28 are fabricated on body 26.

Step 3. Optical fiber 48 is secured to substrate 20. This may be accomplished by forming trench 38 in substrate 20, positioning optical fiber 48 within trench 38 and securing optical fiber 48 in place using methods well known in the art such as with adhesive resin or mechanical compression.

Step 4. Optical power meter 40 is coupled to optical fiber 48 using methods known in the art so that the optical power that passes through optical fiber 48 can be measured.

Step 5. Meter output line 42 is coupled to optical power meter 40 and processor 44.

Step 6. Processor output line 46 is coupled to processor 44 and charge generator 16.

Step 7. Charge output lines (50a–50d) are coupled to capacitive alignment pads (22a–22d), respectively.

Step 8. Die paddle 30 is secured to laser diode chip 14.

Step 9. After Step 8, laser diode chip 14 is positioned and held on substrate 20 so that the following four conditions are satisfied:

1. Tab 34a is disposed between and in close proximity to capacitive alignment pads (22a, 22b).
2. Tab 34b is disposed between and in close proximity to capacitive alignment pads (22c, 22d).
3. When no electrostatic forces are applied from capacitive alignment pads (22a–22d), tabs (34a, 34b) do not move relative to substrate 20. Furthermore, when electrostatic forces are applied by capacitive alignment pads (22a–22d), tabs (34a, 34b) move to a new position relative to substrate 20.

4. Laser diode chip 14 is not free to move in directions non-parallel to substrate 20.

Step 10. Bond pads (24a–24f) are electrically coupled to bond pads (32a–32f) using, for example, wire bonding with bond wires 36.

Next, the actual steps for alignment will be described below.

Step 1. Laze from laser diode 28 such that at least a portion of the radiation of the laser enters optical fiber 48. Once the laser diode 28 lazes, following steps will occur without human intervention.

Step 2. While laser diode 28 is lazing, optical power meter 40 measures laser power flux through optical fiber 48.

Step 3. Optical power meter 40 drives meter output line 42 with signals representative of the measured power.

Step 4. Processor 44 receives the signals on meter output line 42 and determines whether a maximum power flux through optical fiber 48 has been reached. This may be done according to the above described processes or according to many other processes for determining maximum values, some of which are well known in the art. If maximum power flux has not been reached, processor 44 drives signals through processor output line 46 which represent charging instructions for each of capacitive alignment pads (22a–22d) which are appropriate to cause laser diode 28 to align with optical fiber 48.

Step 5. Charge generator 16 receives the signals on processor output line 46 and charges or discharges capacitive alignment pads (22a–22d) to the voltage instructed by processor 44 through charge output lines (50a–50d).

Step 6. The electrostatic voltage at each of capacitive alignment pads (22a–22d) applies a Coulomb force to tabs (34a, 34b) such that laser diode chip 14 shifts. This causes the power intensity of the laser from laser diode 28 through optical fiber 48 to change.

Step 7. Steps 2–6 repeat frequently or occur continuously until processor 44 determines that maximum power flux through optical fiber 48 has been reached.

Step 8. After maximum power flux has been reached, processor 44 drives status line 52 with a signal that results in laser diode chip 14 being firmly affixed to substrate 20 with laser diode 28 being aligned with optical fiber 48. In one embodiment, affixing laser diode chip 14 to substrate 20 is done by applying radio frequency radiation or infrared radiation from interface 64 to an adhesive previously applied to the contact area between body 26 and substrate 20. The adhesive is composed of a material that is liquid or flexible but is converted to a solid, relatively rigid material upon exposure to radio or infrared frequency radiation. One example of a material that converts to a solid, relatively rigid material upon exposure to infrared frequency radiation is Ablestick 8390. The above process can be performed in less than one minute.

Therefore, the present invention overcomes disadvantages inherent in the prior art. First, the alignment process can be fully automated thus minimizing the risk of human error in the alignment process. Furthermore, the structure and method require few, if any, moving mechanical parts in order to align the laser. Having few moving parts typically increases reliability and reduces expense. Lastly, the process typically takes less time thereby contributing to increased throughput.

The principles of the present invention are not limited in scope to the described embodiment. Accordingly, other embodiments and variations not described herein may be considered within the scope of our invention as defined by one or more of the following claims.

What is claimed is:

1. A laser diode package comprising:
    a support comprising a substrate and at least one capacitive alignment pad rigidly attached to said substrate;
    a charge generator configured to charge or discharge said at least one capacitive alignment pad to respective voltages in response to an instruction to charge or discharge said at least one capacitive alignment pad to said respective voltages;
    an object comprising a main body, and a conductive die paddle attached to said main body; and
    a holder for movably positioning said object relative to said at least one capacitive alignment pad, wherein said conductive die paddle is positioned with respect to said at least one capacitive alignment pad such that when an electric charge is applied to one of said at least one capacitive alignment pad, Coulomb forces will move said conductive die paddle with respect to said at least one capacitive alignment pad.

2. The laser diode package of claim 1 wherein said object is a laser diode chip and further comprises a laser diode.

3. The laser diode package of claim 2 further comprising:
    a feedback mechanism configured to determining an alignment of said laser diode compared to an optimal alignment, said feedback mechanism further configured to estimate said respective voltages for each of said one or more capacitive coupling pads necessary to cause Coulomb forces that would cause said laser diode to move more into alignment with said optical fiber.

4. The laser diode package of claim 3 wherein said feedback mechanism comprises:
    an optical fiber having an end fixed to said substrate, said laser diode positioned such in closed proximity to said end; and
    an optical power meter configured to determine an optical power level through said optical fiber and write said optical power level to an interface.

5. The laser diode package of claim 4 wherein said interface comprises a processor, said processor configured to read said optical power level, estimate said respective voltages for each of said at least one capacitive coupling pads that would cause said laser diode to align with said optical fiber, and write said instruction to said charge generator.

6. The laser diode package of claim 5 wherein said laser diode chip is positioned such that at least a portion of a laser from said laser diode enter said end of said optical fiber.

7. The self aligning laser diode package of claim 5 wherein said processor is further configured to determine whether said laser diode is aligned with said optical fiber such that a maximum level of optical power for said laser diode enters said optical fiber.

8. The laser diode package of claim 5 wherein said processor is further configured to drive a line with a signal indicative of a status of whether said maximum level of optical power is present in said optical fiber.

9. The laser diode package of claim 8 wherein said line is coupled to a bond mechanism, said bond mechanism configured to affix said laser diode chip to said substrate in response to said signal.

10. The laser diode package of claim 9 wherein said bond mechanism comprises an RF heat generator.

11. The laser diode package of claim 1 wherein said at least one capacitive alignment pad comprises at least four capacitive alignment pads.

12. The laser diode package of claim 11 wherein said conductive die paddle further comprises a first tab and a second tab, said first tab positioned between two of said at least four capacitive alignment pads, said second tab positioned between another two of said at least four capacitive alignment pads.

13. A method of aligning a laser diode comprising the following steps:
   determining a position of a laser diode chip on a substrate with respect to an aligned position on said substrate, said laser diode chip comprising a conductive die paddle rigidly attached to a main body of said laser diode chip;
   after determining a position, estimating respective voltages for at least one capacitive coupling pads necessary to apply a Coulomb force to said conductive die paddle sufficient to align said laser diode chip; and
   after estimating respective voltages, charging said at least one capacitive coupling pads with said respective voltages.

14. The method of claim 13 wherein said step of determining a position further comprises:
   lazing from a laser diode on said laser diode chip into an optical fiber rigidly attached at an end to said substrate; and
   measuring an optical power level through said optical fiber.

15. The method of claim 13 wherein said step of determining a position further comprising the steps of:
   determine whether said position is an optimally aligned position; and
   sending a signal indicative of said position being an optimally aligned position if it is determined that said position is an optimally aligned position.

16. The method of claim 15 further comprises bonding said laser diode chip to said substrate if said signal is indicative of an optimally aligned position.

* * * * *